United States Patent [19]
Tanaka

[11] Patent Number: 5,654,730

[45] Date of Patent: Aug. 5, 1997

[54] LIQUID CRYSTAL DISPLAY DEVICE

[75] Inventor: Kazuo Tanaka, Tanashi, Japan

[73] Assignee: Citizen Watch Co., Ltd., Tokyo, Japan

[21] Appl. No.: 291,934

[22] Filed: Aug. 16, 1994

[51] Int. Cl.$^6$ .................................................. G09G 3/36
[52] U.S. Cl. .................................... 345/87; 349/139
[58] Field of Search ........................ 345/98, 205, 87; 359/87, 88, 82

[56] References Cited

U.S. PATENT DOCUMENTS

| | | | |
|---|---|---|---|
| 4,862,153 | 8/1989 | Nakatani et al. | 345/98 |
| 5,016,986 | 5/1991 | Kawashima et al. | 359/87 |
| 5,293,262 | 3/1994 | Adachi et al. | 359/88 |

*Primary Examiner*—Mark R. Powell
*Assistant Examiner*—Matthew Luu
*Attorney, Agent, or Firm*—Finnegan, Henderson, Farabow, Garrett & Dunner, L.L.P.

[57] ABSTRACT

A constitution of a liquid crystal display apparatus, which has reduced a total size thereof while maintaining the necessary size of a liquid crystal display panel, is provided.

A liquid crystal display apparatus 1 comprising a liquid crystal display panel 2, a plurality of drive circuit substrates 3, 4-1, 4-2 for the liquid crystal display panel 2 and a control circuit substrate 5, wherein the first drive circuit substrate 3 as at least a part of said drive circuit substrate 1 is connected to the liquid crystal display panel 2 via a flexible connection wiring portion 30, second drive circuit substrates 4-1, 4-2, as the remaining drive circuit substrate are connected fixedly to the liquid crystal display panel 2, the second drive circuit substrates 4-1, 4-2 being provided with flexible connection wiring portions 61, 62, one end portions E of the flexible connection wiring portions 61, 62 are provided with connector inserting means 63, 64, and the control circuit substrate 5 is provided with input/output connector means 51, 52 which are engaged with the connector inserting means 63, 64 for connection purposes.

7 Claims, 3 Drawing Sheets

LIQUID CRYSTAL DISPLAY DEVICE

BACKGROUND OF THE INVENTION

1. Field of the Invention

The present invention relates to a liquid crystal display apparatus and, more specifically to a liquid crystal display apparatus which allows the total size of a liquid crystal display apparatus to be reduced by reducing the area occupied by the drive control system provided at the periphery of a liquid crystal display panel.

2. Description of the Related Art

As a standard constitution of a liquid crystal display apparatus, as shown in FIG. 4, a liquid crystal display panel 2 is provided, and one side 21 of such liquid crystal display panel 2 is provided with a common electrode drive circuit substrate 3 comprising a plurality of drive circuits $IC_{31}$ to $IC_{3n}$ for driving and controlling common electrodes (Y electrodes) to control scanning and timing of an image, while a pair of sides 22, 23 of the liquid crystal panel 2 are provided with segment electrode drive circuit substrates 4-1, 4-2 comprising a plurality of drive circuits $IC_{41}$ to $IC_{4n}$ for driving and controlling segment electrodes (X electrodes) for inputting image information.

Moreover, in a liquid crystal display apparatus described above, a control circuit substrate 5 comprising an LSI or the like for individually driving and controlling drive circuits $IC_{31}$ to $IC_{3n}$ and $IC_{41}$ to $IC_{4n}$ provided on the common electrode drive circuit substrate 3 and segment electrode drive circuit substrates 4-1, 4-2, an input/output means 6 and a peripheral circuit substrate 8 composed of a central arithmetic means 7 or the like formed of a microcomputer or the like for controlling the control circuit substrate 5 are provided.

In such a liquid crystal display apparatus 1 of the prior art, the common electrode drive circuit substrate 3 and segment electrode drive circuit substrates 4-1, 4-2 described above are in general fixed integrally and fixedly to side edges of the liquid crystal display panel 2 and the drive circuits $IC_{31}$ to $IC_{3n}$ and $IC_{41}$ to $IC_{4n}$ provided on the common electrode drive circuit substrate 3 and segment electrode drive circuit substrates 4-1, 4-2 are connected with predetermined input/output terminals of the control circuit substrate 5 via adequate wirings 9, 10, 11 or the like.

Therefore, since the respective sizes of the common electrode drive circuit substrate 3 and segment electrode drive circuit substrates 4-1, 4-2 are added to the size of the relevant liquid crystal display panel 2 in the liquid crystal display apparatus 1 of the prior art, the total size of the liquid crystal display apparatus 1 is inevitably increased to a size considerably larger than the relevant liquid crystal display panel 2. Accordingly, if it was required to reduce the total size of the relevant liquid crystal display apparatus 1, it was achieved at the cost of reducing the size of the liquid crystal display panel 2 itself.

Moreover, as illustrated in FIG. 4, when the drive circuits are mounted directly on a liquid crystal display panel for driving the common electrodes and segment electrodes, the liquid crystal display panel 2, for example, contains a liquid crystal material that is held or inserted between at least two sheets of transparent glass substrates or plastic substrates and the periphery of the liquid crystal is hermetically sealed with a sealing material. In the above-mentioned case of the so-called COG (Chip On Glass) constitution, the drive circuits $IC_{41}$ to $IC_{4n}$ are directly mounted on and held by the substrate glass in the face-down mounting basis, at almost the edge portion of the substrate and at the external side of the sealing material of substrate. Therefore the control circuit substrate 5 and the liquid crystal display panel 2 are connected to each other as illustrated in FIG. 4 and therefore the input/output terminals are arranged so as to be concentrated to an end side surfaces of the liquid crystal display panel 2 and that of the control circuit substrate 5, each opposing to each other.

Thereby, the gaps between the adjacent input/output terminals must be narrow or the electrodes must be thin, resulting in problems that the electrodes are short-circuited, broken or have a high resistance.

Further, in the prior art in which a liquid crystal display apparatus is produced in such a way that the control circuit substrate is first constituted together with the common electrode drive circuit and then the combined substrates are connected to the liquid crystal display via a flexible connection wiring portion, another problem arises in that some differences are generated between the yield in mounting the drive circuits on a substrate for control circuits and that for the common electrode drive circuit, therefore the yield of the liquid crystal display panel is necessarily determined by one of the above-mentioned yields, whichever worse. Thus, this fact allows to increase the manufacturing cost of the liquid crystal display apparatus.

SUMMARY OF THE INVENTION

It is therefore an object of the present invention to provide a liquid crystal display apparatus which has advantages over the prior art and can reduce a total size of the apparatus while maintaining the necessary size of the liquid crystal display panel. The present invention also provides, a liquid crystal display apparatus which overcomes the problems such as an increase in short-circuits between adjacent input/output terminals, the breaking of wire or an increase in electrode resistance and moreover is cheaper to manufacture and the yield in mounting ICs on the substrate is improved.

In view of achieving the object described above, the present invention basically employs a technology and a constitution that will be explained hereunder. That is, the present invention proposes a liquid crystal display apparatus 1 comprising a liquid crystal display panel 2, a drive circuit substrate 3, 4-1, 4-2 including a panel drive IC groups 31-3n, 41-4n arranged in the periphery of the liquid crystal display panel 2 to drive this panel and a control circuit substrate 5 connected to the drive circuit substrate for individually driving and controlling the panel drive ICs of the drive circuit substrate, in which a first drive circuit substrate which is at least a partial drive circuit substrate is connected to the liquid crystal display panel 2 via a first flexible connection wiring portion 30 and a second drive circuit substrate 4-1, 4-2 as the remaining drive circuit substrate, is connected fixedly to the liquid crystal display panel, whereby the second drive circuit substrate is connected to a second flexible connection wiring portion 61, 62 which is connected to input terminals of panel second drive ICs provided on the drive circuit substrate 4-1, 4-2 for supplying thereto a control signal to individually drive and control the relevant panel drive ICs, one end of the second flexible connection wiring portion 61, 62 is provided with a connector insertion means 63, 64, the control circuit substrate 5 is provided with a connector means 51, 52 for outputting a control signal to individually drive and control the panel drive ICs 41-4n provided on the second drive circuit substrate 4-1, 4-2, and the connector means 51, 52 and connector insertion means 63, 64 are constituted to establish engagement therebetween for the connection purpose.

In the above-mentioned embodiment of the present invention, it is explained that the second substrates 4-1, 4-2 are separately formed from the liquid crystal display panel 2 and the second substrates 4-1, 4-2 are connected integrally to the display panel 2.

However, the present invention is not restricted only to the above-mentioned embodiment and the following embodiment is also included into the present invention.

Namely, the second substrates 4-1, 4-2 are not separately fabricated from the display panel 2, previously but the drive circuits 41 to 4n can be mounted on end portions of the glass substrate forming a part of the display panel 2.

In this embodiment, the second drive circuit substrate is previously fabricated on the display panel 2.

Moreover, in the liquid crystal display apparatus 1 of the present invention, with the basic constitution described above, the first drive circuit substrate 3 connected to the liquid crystal display panel 2 via the first flexible connection wiring portion 30, or both the first drive circuit substrate 3 and the control circuit substrate 5 for controlling first drive of the drive circuit substrate 3 are arranged in such a manner that they can be folded to the lower side of the rear surface of the liquid crystal display panel 2.

The liquid crystal display apparatus 1 of the present invention realizes, through employment of the basic technique and constitution described above, an arrangement where the drive circuit substrate is folded into the position below the rear surface of the liquid crystal display panel 2. Thereby, the region occupied by at least a part of the drive circuit substrate arranged in the periphery of the liquid crystal display panel of the liquid crystal display apparatus can be eliminated and the peripheral circuit area of the liquid crystal display panel can be reduced in size. As a result, a total size of the liquid crystal display apparatus can be reduced, while maintaining the necessary size of the liquid crystal display panel.

Furthermore, in the liquid crystal display apparatus 1 of the present invention, a part of the drive circuit substrate 4-1, 4-2 connected directly to the liquid crystal display panel 2 is connected with a flexible second connection wiring portion 61, 62 including a connection wiring for supplying a control signal to individually drive and control the panel drive ICs, 41-4n one end portion of the second flexible connection wiring portion 61, 62, that is, end portion thereof near the control circuit substrate 5 is provided with a connector insertion means 63, 64 in which the end portions 61, 62 of respective wiring portions are concentrated, the control circuit substrate is provided with a connector means 51, 52 for outputting a control signal to individually drive and control the panel drive ICs 41-4n provided on the second drive circuit substrate 4-1, 4-2 and the connector means 51, 52 and connector insertion means 63, 64 are constituted to establish engagement therebetween for the connection.

As described, since the control circuit substrate 5 is so constituted that the connector insertion means 63, 64 can be easily inserted into the connector means 51, 52, even when the substrate 5 is arranged at the portion below the rear surface of the liquid crystal display panel 2, by suitably curving or folding the flexible connection wiring portion 61, 62, the assembly operation can be realized easily and working efficiency can also be improved remarkably, providing possibility of manufacturing a small size liquid crystal display panel comprising a stable and reliable connecting portion.

DESCRIPTION OF THE PREFERRED EMBODIMENT

A preferred embodiment of a liquid crystal display apparatus of the present invention will be explained in detail with reference to the accompanying drawings.

Figure 1:
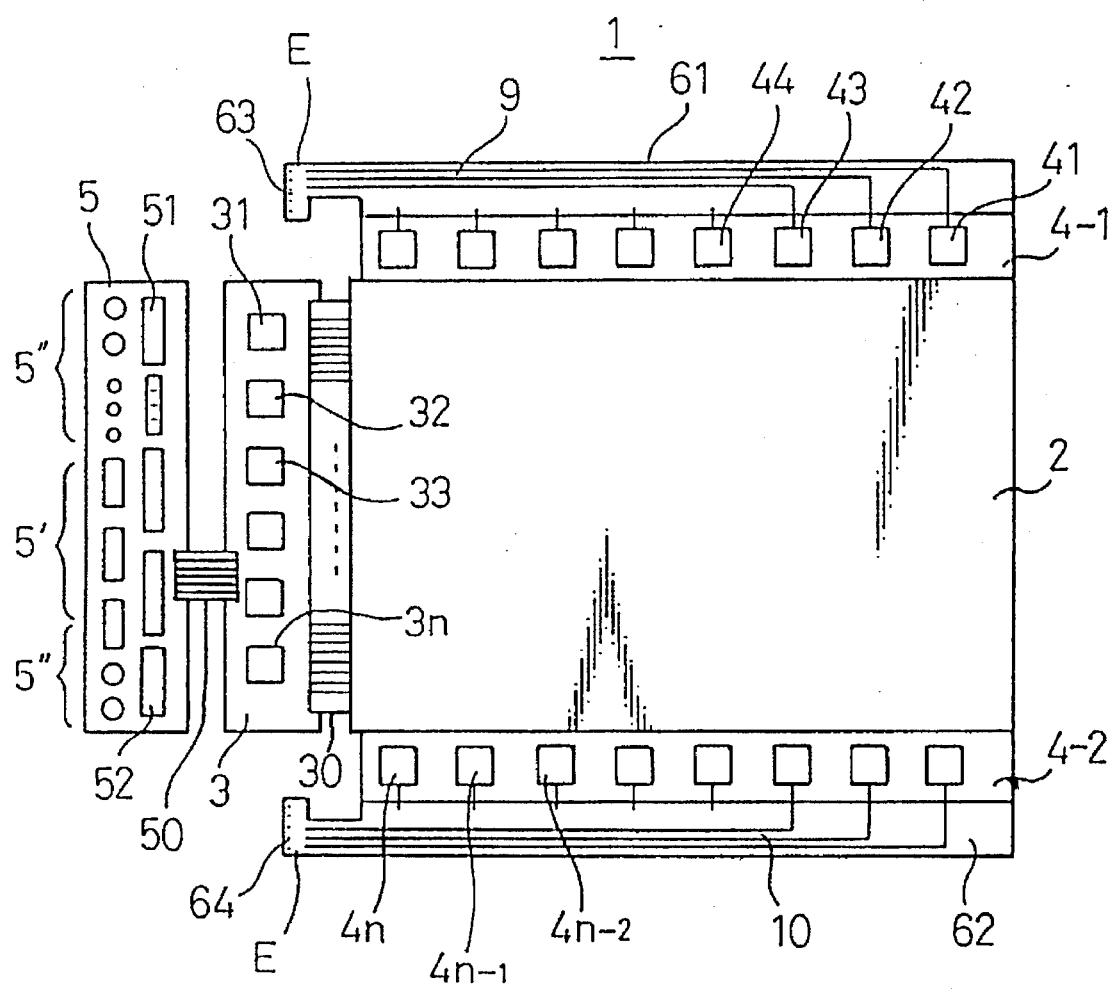
FIG. 1 is a top view illustrating a constitution of an embodiment of a liquid crystal display apparatus of the present invention.

Namely, FIG. 1 is a top view illustrating a constitution of an embodiment of a liquid crystal display apparatus of the present invention.

As shown in this figure, the liquid crystal display apparatus 1 comprises a liquid crystal display panel 2, drive circuit substrates 3, 4-1, 4-2 including panel drive circuits $IC_{31}$ to $IC_{3n}$ and $IC_{41}$ to $IC_{4n}$ which are arranged in the periphery of the liquid crystal display panel 2 to drive this panel and a control circuit substrate 5 which is connected to the drive circuit substrates 3, 4-1, 4-2 to individually drive and control the panel drive circuits $IC_{31}$ to $IC_{3n}$ and $IC_{41}$ to $IC_{4n}$, wherein a first drive circuit substrate 3 as at least a part of the drive circuit substrate is connected to the liquid crystal display panel 2 via a first flexible connection wiring portion 30 and a second drive circuit substrates 4-1, 4-2 as the remaining drive circuit substrates are fixedly connected to or directly mounted on the liquid crystal display panel 2. Moreover, to the second drive circuit substrates 4-1, 4-2, a flexible second connection wiring portions 61, 62 including the connection wirings 9, 10 connected to the panel drive circuits $IC_{41}$–$IC_{4n}$ provided on the substrate and for supplying a control signal to individually drive and control the panel drive circuits $IC_{41}$ to $IC_{4n}$, are connected. On the other hand, one ends E of the second flexible connection wiring portions 61, 62 are provided with the connecting insertion means 63, 64, the control circuit substrate 5 is provided with the input/output connector means 51, 52 for outputting a control signal to individually drive and control the panel drive circuits $IC_{41}$ to $IC_{4n}$ provided on the second drive circuit substrates 4-1, 4-2, and these connector means 51, 52 and connector insertion means 63, 64 are constituted to establish engagement therebetween for the connection.

In another embodiment of the present invention, the panel drive circuits $IC_{41}$ to $IC_{4n}$ can be mounted on the second flexible connection wiring portion 61, 62 instead of the drive circuits being mounted on the glass substrate.

Since the flexible connection wiring portions 30, 61, 62 are properly used in combination, particularly the free end portions E of the flexible connection wiring portions 61, 62 are provided with the connector inserting means 63, 64 and the connector means 51, 52 for accepting the connector inserting means 63, 64 are arranged on the control circuit substrate, the connecting portion between the connector inserting means 63, 64 and connector means 51, 52 can be compactly arranged on the periphery of the lower part of the liquid crystal display panel 2 by folding, curving and bending as required the flexible connection wiring portions 30, 61, 62. As a result, a total size of the apparatus can be reduced while maintaining the size of the image display area of the liquid crystal display panel 2.

Namely, in the liquid crystal display apparatus 1 illustrated in FIG. 1, as an example, the common electrode drive circuit substrate 3 providing a plurality of drive circuits $IC_{31}$ to $IC_{3n}$ to drive and control the common electrodes (Y electrodes) is connected to the liquid crystal display panel 2 via the flexible connection wiring portion 30, as the first drive circuit substrate 3 particularly for scanning an image and controlling the timing among the first drive circuit substrate 3 and the second drive circuit substrates 4-1, 4-2 connected to the liquid crystal display panel 2 and the common electrode drive circuit substrate 3 as the first drive circuit substrate can be constituted so that it can be folded, curved and bent for the liquid crystal display panel 2.

That is, respective output terminals of a plurality of drive circuits $IC_{31}$ to $IC_{3n}$ provided on the common electrode drive circuit substrate 3 are connected to each of wirings printed on the first flexible connection wiring portion 30 and thus the output terminals of each one of the drive circuits $IC_{31}$ to $IC_{3n}$ are connected to respective common electrodes (Y electrodes) of the liquid crystal display panel 2 via each wiring.

The liquid crystal display apparatus 1 of the present invention offers an example, as shown in FIG. 1, that the first drive circuit substrate 3 is connected in flexible to the liquid crystal display panel 2 and the second drive circuit substrates 4-1, 4-2 as the other drive circuit substrate, that is, the second drive circuit substrates 4-1, 4-2 including a plurality of drive circuits $IC_{41}$ to $IC_{4n}$ to drive and control the segment electrodes (X electrodes) are arranged, for example, fixedly or integrally, to the liquid crystal display panel 2. However, the liquid crystal display apparatus 1 of the present invention is not limited only to this example and it is of course possible for the liquid crystal display apparatus of the present invention to have the constitution that the drive circuit substrates 4-1, 4-2 are electrically connected to respective segment electrodes (X electrodes) of the liquid crystal display panel 2 via the wirings printed on the second flexible connection wiring portions 61, 62 and the common electrode drive circuit substrate 3 is fixedly connected to the liquid crystal display panel 2.

Moreover, it is also possible to employ the constitution that a plurality of drive circuits $IC_{41}$ to $IC_{4n}$ to drive and control the segment electrode (X electrodes) are mounted on the second flexible connection wiring portions 61, 62 and all drive circuit substrates 3, 4-1, 4-2 are connected to the liquid crystal display panel via the wirings printed on the flexible connection wiring portions 30, 61, 62.

Here, as the first flexible connection wiring portion 30 used in the present invention to connect between the first drive circuit substrate 3 and the liquid crystal display panel 2, and/or the second flexible connection wiring portions 61, 62 to connect between the second drive circuit substrates 4-1, 4-2 and the control circuit. substrate 5, and moreover as a separate flexible connection wiring portion 50 i.e., a third flexible connection wiring portion, to connect between the first drive circuit substrate 3 and control circuit substrate 5, those forming the wiring portion so composed of the predetermined number of lines of lead patterns which can be obtained, for example, by etching copper foil on a base film made of polyimide resin can be used.

Figure 2:
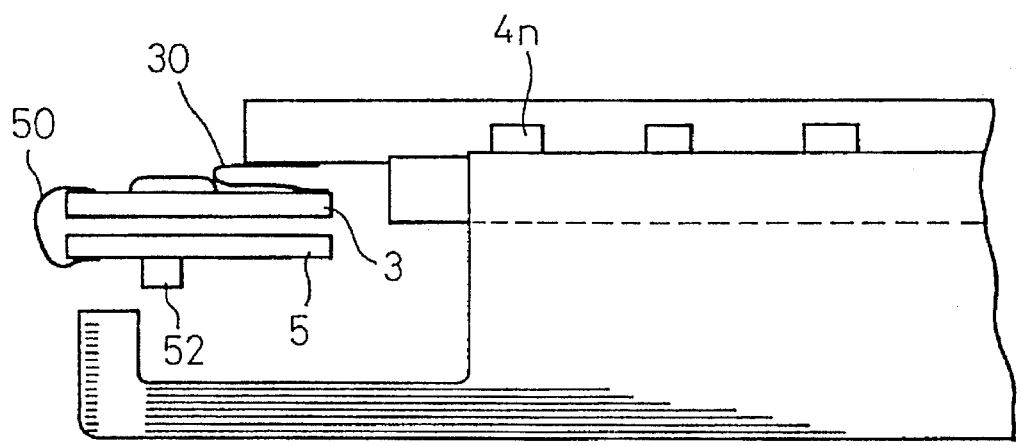
FIG. 2 is a side elevation illustrating a constitution of an embodiment of the liquid crystal display apparatus of the present invention.

In the present invention, since the relevant liquid crystal display apparatus I has the constitution described heretofore, it is desirable that the drive circuit substrate 3 connected to the liquid crystal display panel 2 via the first flexible connection wiring portion 30 is arranged, as illustrated in FIG. 2, at the lower area of the rear surface of the liquid display panel 2 by folding the flexible connection wiring portion 30 utilizing its flexibility.

Employment of such constitution has realized the elimination of the space region having been occupied physically by the drive circuit substrate 3 and control circuit substrate 5.

That is, it is thereby possible to arrange the drive circuit substrate 3 and control circuit substrate 5 in a vicinity of a portion of the liquid crystal display panel, in which only a connecting portion formed between the liquid crystal display panel 2 and connection wiring portion 30 are provided and the portion thereof is not used for displaying an image.

Furthermore, in another embodiment of the liquid crystal display apparatus 1 of the present invention, it is preferable that among the control circuit substrate 5 including the first drive circuit substrate 3 and the second drive circuit substrates 4-1, 4-2, a control circuit substrate 5 to drive and control, at least the first drive circuit substrate 3 connected to the liquid crystal display panel 2 via the flexible first connection wiring portion 30, that is the common electrodes (Y electrodes) drive circuit substrate 3 is connected to the drive circuit substrate 3 via the separate flexible connection wiring portion 50, i.e., a third flexible connection wiring portion.

As described, in the present invention, it is similarly possible that when a drive control circuit 5' for driving and controlling the first drive circuit substrate 3 and a drive control circuit 5" for driving and controlling the second drive circuit substrates 4-1, 4-2 of the control circuit substrate 5 are formed in different circuit substrates, the first drive circuit substrate 3 and only the drive control circuit 5' for driving and controlling the first drive circuit substrate 3 is connected with the flexible connection wiring portion 50 and moreover, when the drive control circuit 5' for driving and controlling the first drive circuit substrate 3 and the drive control circuit 5" for driving and controlling the second drive circuit substrates 4-1, 4-2 are formed on the same substrater the control circuit 5 as a whole is connected to the first drive circuit substrate 3 via the flexible connection wiring portion 50.

In these cases, as described previously, the connecting operation can be performed easily, while the flexible connection wiring portions 30, 50, 61, 62 are being properly bent, curved and folded, by connecting the second drive circuit substrates 4-1 and 4-2 to the drive control circuit 5" for driving and controlling the second drive circuit substrates 4-1, 4-2 via the flexible connection wiring portions 61, 62 and moreover inserting the connecting inserting means 63, 64 provided at the one end portions of the flexible connection wiring portions 61, 62 into the connector means 51, 52 provided in the drive control circuit 5" for driving and controlling the second drive circuit substrates 4-1, 4-2 in order to establish the engagement therebetween for the connection purpose.

Therefore, in the embodiments of the present invention described above, as shown in FIG. 2, for example, the drive circuit substrate 3 connected to the liquid crystal display panel 2 via the flexible connection wiring portion 30 and the control circuit substrate 5 connected to the drive circuit substrate 3 via the flexible connection wiring portion 50 are arranged at the lower part of the rear surface of the liquid crystal display panel 2 under the condition that these are folded and stacked with each other.

In the other embodiment of the present invention described above, the space region having been occupied by the control circuit substrate 3 and drive circuit substrate 5 can be eliminated and therefore the area of the peripheral control circuit of the liquid crystal display panel 2 in the liquid crystal display apparatus 1 can be reduced remarkably.

On the other hand, connection mainly between the common electrode (Y electrodes) drive circuit substrate 3 and the control circuit substrate 5 in an embodiment of the liquid crystal display apparatus of the present invention has been explained and an example of the connection between the second drive circuit substrates 4-1, 4-2 of the liquid crystal display apparatus 1 of the present invention and the control circuit substrate 5 will then be explained with reference to FIG. 1 to FIG. 3.

In the embodiment described above, the second drive circuit substrates 4-1, 4-2 is connected fixedly, as an example, to the liquid crystal display panel 2. In this example, a plurality of drive circuits $IC_{41}$ to $IC_{4n}$ which are provided on the second drive circuit substrates 4-1 and 4-2 to drive and control the segment electrode (X electrodes) are connected respectively, for example, to the wiring portions 9, 10 of the flexible wiring portions 61, 62 on which the wiring portions formed of the predetermined number of lines of lead patterns obtained by etching copper foil to a base film made of polyimide resin.

This connecting method in this constitution may be replaced with a method using anisotropic conductive bonding agent mixing conductive particles into a resin bonding agent or a method using solder.

On the other hand, the connector inserting means 63, 64 are individually formed at one end portions of the flexible wiring portions 61, 62 and these connector inserting means 63, 64 can individually be engaged with input or output connector means 51, 52 for the control circuits of the second drive circuit substrates 4-1 and 4-2.

Figure 3:
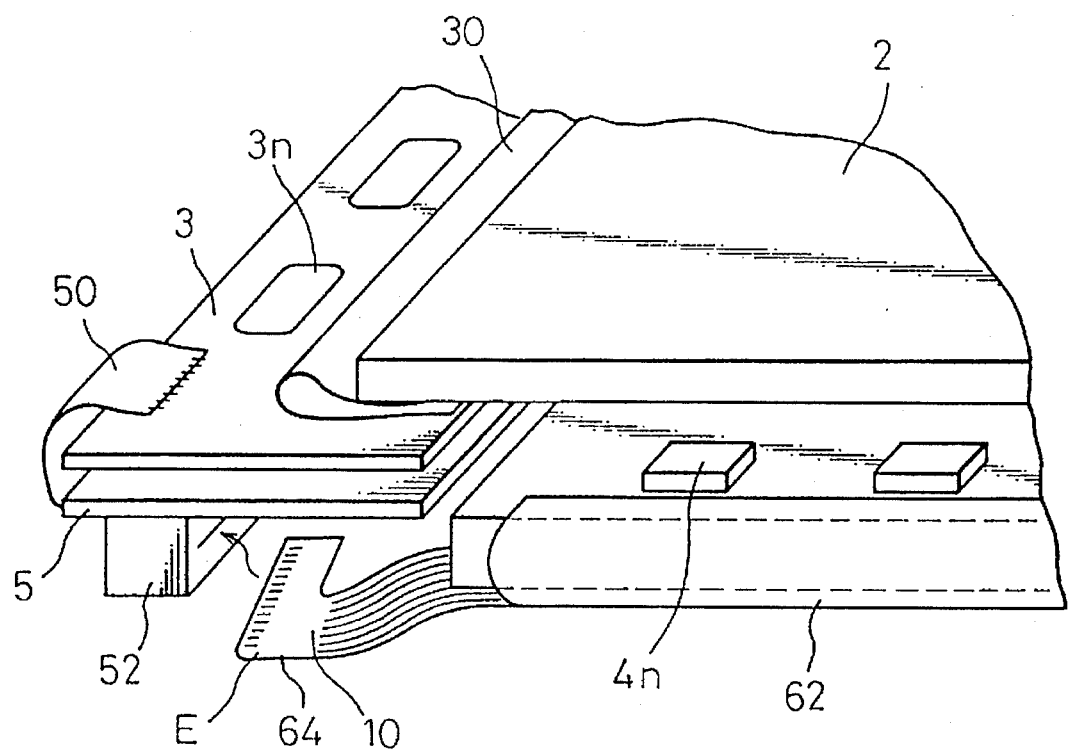
FIG. 3 is a perspective view illustrating a constitution of another embodiment of the liquid crystal display apparatus of the present invention.
Figure 4:
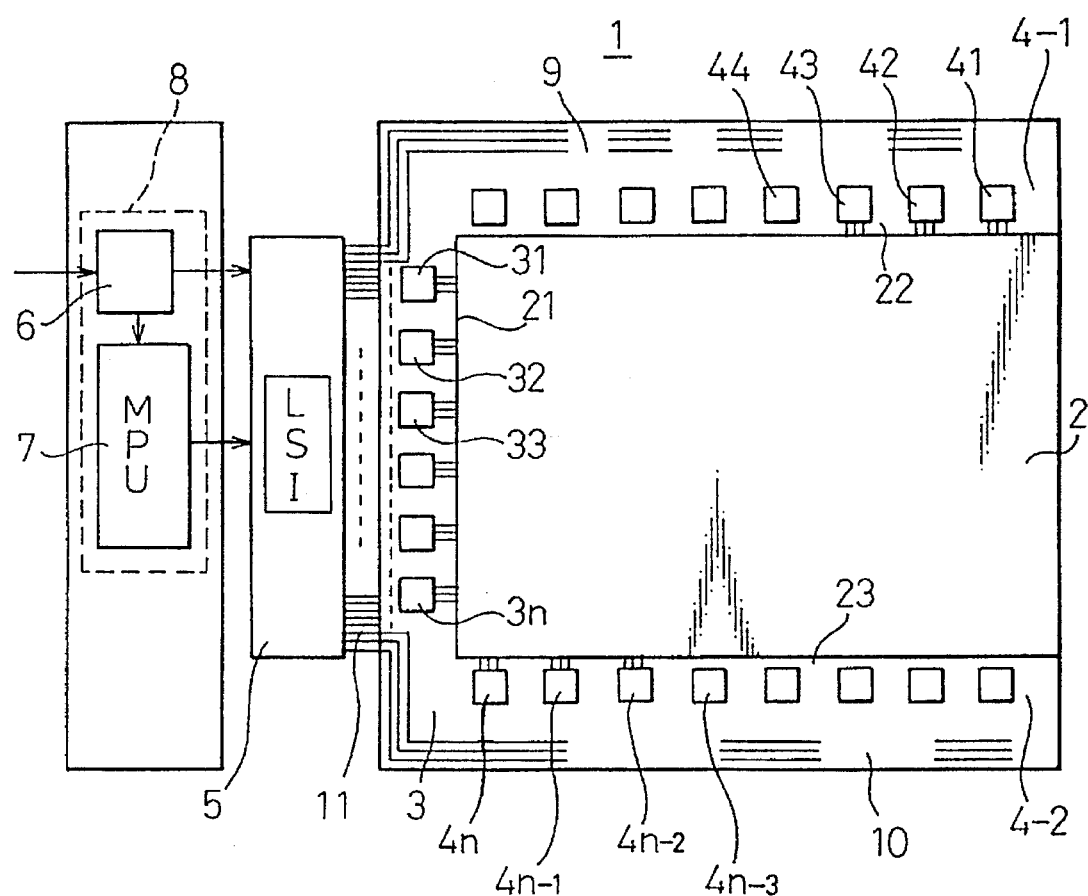
FIG. 4 is a plan view illustrating an example of constitution of a liquid crystal display apparatus of a prior art.

As described above and shown in FIG. 2, it is preferable, under the condition that the control circuit substrate 5 and the drive circuit substrate 3 are folded and stacked at the lower area of the rear surface of the liquid crystal display panel 2, that the flexible wiring portions 61, 62 connected to the second drive circuit substrates 4-1, 4-2 are curved or folded as shown in FIG. 3 to turn into the lower area of the rear surface of the liquid crystal display panel 2 so that the connector inserting means 63, 64 provided at one ends of the flexible wiring portions 61, 62 can be individually engaged for the connection purpose with the input or output connector means 51, 52 for the control circuit signal of the second drive circuit substrates 4-1, 4-2 provided on the control circuit substrate 5 described above.

Employment of such constitution enables elimination of at least the space region corresponding to the wiring portions 61, 62 at the upper and lower edge portions of the liquid crystal display panel 2, resulting in much contribution to size reduction of the liquid crystal display apparatus 1.

Owing to the technique and constitution described above, the liquid crystal display apparatus 1 of the present invention has realized arrangement of the drive circuit substrate located at the lower part of the rear surface of the liquid crystal display panel while the drive circuit substrate is set in the folded condition. Thereby, the space region having been occupied by at least a part of the drive circuit substrate arranged in the periphery of the liquid crystal display panel of the liquid crystal display apparatus can be eliminated or saved and the area of the peripheral circuit of the liquid crystal display panel can be reduced as much as such area saving and a total size of the liquid crystal display apparatus can be reduced, while keeping the necessary size of the liquid crystal display panel.

Moreover, the present invention can provide a liquid crystal display apparatus which has overcome the problems, even when the size thereof is reduced, that the short-circuit or breaking of wires between the input and output terminals is increased or electrode resistance becomes high because some allowance is given in the gap between the adjacent input and output terminals. Moreover, the manufacturing cost thereof is reduced by improving the yield in mounting the drive circuits on a substrate for control circuits and that for the common electrode drive circuit.

Namely, in the present invention, since the control circuit substrate 5 and the drive circuit substrates 3 are fabricated separately to each other and accordingly when the display panel 2 is manufactured, a correctly formed control circuit substrate 5 and a correctly formed drive circuit substrates 3 are selectively combined to each other to form the final product of the display panel 2.

Therefore, in the present invention, the yield of the liquid crystal display panel 2 can be improved.

I claim:

1. A liquid crystal display apparatus comprising a liquid crystal display panel, a drive circuit substrate including panel drive IC groups arranged on the periphery of said liquid crystal display panel to drive said panel, and a control circuit substrate connected to said drive circuit substrate for individually driving and controlling the panel drive ICs of said drive circuit substrate, said drive circuit substrate including a first drive circuit substrate, which is at least a partial drive circuit substrate and a second drive circuit substrate as the remaining drive circuit substrate, said second drive circuit substrate being connected to a flexible connection wiring portion which is connected to input terminals of panel drive ICs provided on said second drive circuit substrate for supplying thereto a control signal to individually drive and control the relevant panel drive ICs, one end of said flexible connection wiring portion is provided with a connector inserting means, said control circuit substrate is provided with a connector means for outputting a control signal to individually drive and control said panel drive ICs provided on said second drive circuit substrate, and said connector means and connector inserting means are constituted to establish engagement therebetween for connection purposes.

2. A liquid crystal display apparatus according to claim 1, wherein said second drive circuit substrate is connected to said liquid crystal display panel via a connection wiring portion which is flexible.

3. A liquid crystal display apparatus according to claims 1 or 2, wherein at least one of said first and second drive circuit substrates connected to said liquid display panel via said first or second flexible connection wiring portion is arranged at a position below the rear surface of said liquid crystal display panel.

4. A liquid crystal display apparatus according to claims 1 or 2 or 3, wherein said engagement formed between said connector means provided to said control circuit substrate and said connector inserting means formed in said second flexible connection wiring portion is located at the position below the rear surface of said liquid crystal display panel.

5. A liquid crystal display apparatus according to any one of claims 1 to 4, wherein said control circuit substrate connected to at least said first drive circuit substrate among said control circuit substrates is connected to said first drive circuit via a separate flexible connection wiring portion.

6. A liquid crystal display apparatus according to claim 5, wherein said first drive circuit substrate connected to said liquid crystal display panel via said first flexible connection wiring portion and said control circuit substrate connected to said first drive circuit substrate via said separate flexible connection wiring portion, are folded and stacked against each other and are then arranged at said position below the rear surface of said liquid crystal display panel.

7. A liquid crystal display apparatus according to claim 6, wherein said first drive circuit substrate and control circuit substrate are stacked against each other in the condition that said flexible connection wiring portion is bent.

* * * * *